United States Patent [19]

Walsh

[11] Patent Number: 5,382,910

[45] Date of Patent: Jan. 17, 1995

[54] DUAL TIME BASE ZERO DEAD ZONE TIME DOMAIN REFLECTOMETER

[75] Inventor: Joseph F. Walsh, Lynnwood, Wash.

[73] Assignee: John Fluke Mfg. Co., Inc., Everett, Wash.

[21] Appl. No.: 43,512

[22] Filed: Apr. 6, 1993

[51] Int. Cl.⁶ ............................................. G04F 8/00
[52] U.S. Cl. ................................... 324/533; 324/532; 324/76.82; 368/119; 377/20
[58] Field of Search ................ 342/135, 136; 368/119, 368/120; 377/20; 324/533, 532

[56] References Cited

U.S. PATENT DOCUMENTS

| | | | |
|---|---|---|---|
| 4,164,648 | 8/1979 | Chu | 368/119 |
| 4,168,467 | 9/1979 | Bailey | 368/119 |
| 4,970,466 | 11/1990 | Bolles | 324/533 |

*Primary Examiner*—Kenneth A. Wieder
*Assistant Examiner*—Jose M. Solis
*Attorney, Agent, or Firm*—George T. Noe

[57] ABSTRACT

A dual time base, zero dead zone time domain reflectometer repetitively launches a predetermined number of stimulus pulses into a transmission system in synchronism with clock signals from a first time base, providing a measurement cycle. The duration of the launched stimulus pulses, determined by a predetermined number clock cycles from the first time base, exceeds the total propagation time of the system to be measured so that a time interval between a launch and a reflection may be measured within the launched pulse. A second time base, which has a predetermined period that differs from the period of the first time base and defines a measurement period divided into equal sub-periods, continuously produces clock signals, one or more of which may be counted during the time interval. The result is that over a predetermined number of repetitive pulses launched and associated time intervals presented to the second time base and count logic circuits, a count signal will be produced for each incremental sub-period occurring during the time interval being measured. Accordingly, the total count is proportional to the duration of the time interval being measured. Since the measured time interval is produced by the launched pulse and its reflection, there is no dead zone. Also, the circuit design is very simple, and lends itself to manifestation in a low cost, low power, hand-held and battery operated TDR for locating faults on 10 base-T, Token Ring, T1, Telco lines, and other twisted-wire pair applications in local area networks, as well as general cable testing.

13 Claims, 5 Drawing Sheets

DUAL TIME BASE ZERO DEAD ZONE TIME DOMAIN REFLECTOMETER

BACKGROUND OF THE INVENTION

This invention relates generally to time domain reflectometers, and in particular to a time domain reflectometer having a dual time base to provide high-resolution, zero dead time measurement of reflection characteristics in all lengths of cables.

A time domain reflectometer (TDR) is an instrument which indicates and measures reflection characteristics of a transmission system by launching a signal into the transmission path and measuring the length of time required to receive a reflection from a discontinuity in the transmission path. Electrical TDRs measure and locate faults, such as opens and shorts, in transmission lines such as cables and the like, and optical TDRs similarly measure and locate faults, such as breaks and kinks, in fiber-optic filaments.

Conventional high-resolution TDRs launch a short-duration pulse into a transmission path and measure the length of time it takes to receive a reflection using a high-speed clock and logic circuits. The distance D from the TDR to the fault (or discontinuity caused by the end of a cable) is proportional to one-half the measured time interval $t_m$ between the launched stimulus pulse and a reflected response. That is to say, a pulse launched into a transmission system travels at a propagation velocity $v_p$, which is a percentage of the speed of light and is approximately equal to eight inches per nanosecond (or 20 centimeters per nanosecond) in an electrical cable, through the transmission system to a discontinuity and reflected therefrom back to the TDR, so that $D = v_p \cdot \frac{1}{2} t_m$. Thus, to resolve a measurement of the distance D to a fault in a cable (or the length L of the cable) to within four inches (10 centimeters) using a conventional TDR would require a measurement clock having a frequency of one gigahertz.

As a practical matter, the power requirements and expense of high-speed clocks preclude their use in most commercial TDR equipment, and so clock rates of around 100 megahertz (MHz) are typical, resulting in typical resolutions of from two to four feet. This sort of resolution may be adequate for cables that are several hundred feet in length; however, when cable lengths of six or twelve feet are being measured, a resolution of from two to four feet is inadequate. Also, TDRs having high-speed circuits are very complex and difficult to interpret, are very expensive, and they consume large amounts of power.

Another problem associated with conventional TDRs is that the measurement circuits are not sensitized to reflections for some brief period of time, e.g., several nanoseconds, following launch of a pulse into the transmission path for various reasons. For one thing, some conventional measurement circuits cannot recognize a reflection while the stimulus pulse is being launched. Another reason for blocking immediate reflections in some prior-art TDR systems is to prevent high-energy launch pulses from damaging measurement circuits in some cases. This brief period of time that the measurement circuits are blocked results in what is known in the art as a dead zone or a blind spot in the first few feet of the transmission path. Dead zone is a key specification of most conventional TDRs because it indicates the minimum length of cable that can be measured. Dead zones of 20 feet are typical.

There are many situations in which it would be desirable to measure relatively short cables, such as those found in a local-area network (LAN) for computers. In a LAN, some of the cables interconnecting computers are relatively short, e.g., six feet in length, while other cables routed through walls and ceilings can be relatively long, e.g., 2000 to 4000 feet in length. A TDR would quickly locate faulty connectors, and even determine how much cable is left on a spool. Such a TDR would have to have to be capable of measuring short cables with high resolution, and it would have be relatively portable, exhibit low power consumption for battery operation, and be inexpensive and easy to use.

SUMMARY OF THE INVENTION

In accordance with the present invention, a dual time base, zero dead zone TDR has been developed which overcomes the foregoing problems and has the desired attributes of high resolution, simple and easy to operate, high portability, low power consumption, and low-cost.

The time domain reflectometer includes a free-running first time base or clock operating at a first predetermined frequency A and a free-running second time base or clock operating at a second predetermined frequency B. Launched stimulus pulses are synchronized with the first time base, and the distance to a fault is measured using the second time base. Operating parameters may be selected so that the resolution of the system is equal to the period of the second time base clock divided by the number of stimulus pulses launched.

A controller, which may suitably be a microprocessor or a simple micro-computer, repetitively and synchronously with the first time base, launches stimulus pulses into a transmission system, such as a cable or twisted pair of wires. The duration of a stimulus pulse is equal to at least the time required for a stimulus pulse and its corresponding reflection to propagate through the transmission system and back to the TDR. This allows time for a reflection from the far end of the transmission system, as well as allowing reflections from close-by faults, e.g., within one foot, to be received before termination of the launched stimulus pulse.

The circuitry includes a time interval detector which repetitively detects a measurement time interval equal to the time between each stimulus pulse and its corresponding reflection. The interval detector produces a gate enable signal, the duration of which accurately represents the measurement time interval on each repetition. The arrangement of the components of the time interval detector is such that propagation delay errors are eliminated, allowing inexpensive and low power components to provide very accurate time measurement.

The continuous clock signal from the second time base is applied to the gate; however, because the clock period may be long compared with the measurement time interval, a clock edge may not pass through the gate on every stimulus pulse launch cycle. On the other hand, one or more clock edges may pass through the gate on each stimulus pulse, so that after a predetermined number of stimulus pulse launch cycles, for example, after 100 repetitions, a number of clock edges proportional to the measurement time interval will pass through the gate and be accumulated in a counter.

The result is that over a predetermined number of repetitive pulses launched and associated measurement time intervals presented to the second time base and count logic circuits, a count signal will be produced for each incremental sub-period of the second time base occurring during the time interval being measured. Accordingly, the total count is proportional to the duration of the time interval being measured. Since the measured time interval is produced by the launched pulse and its reflection, there is no dead zone. Also, the circuit design is very simple, and lends itself to manifestation in a low cost, low power, hand-held and battery operated TDR for locating faults on 10 base-T, Token Ring, T1, Telco lines, and other twisted-wire pair applications in local area networks, as well as general cable testing.

One exemplary embodiment is described in which the frequency of the first time base (clock A) is 9.901 MHz and the frequency of the second time base (clock B) is 10 MHz, with 100 launched stimulus pulses. These parameters were chosen for purposes of explanation because the number N of cycles required by clock A to effect a stimulus pulse for its entire duration results in an increment of one by clock B on each successive stimulus pulse. That is, on each successive launch of a stimulus pulse, the sub-period addressed for counting will increment by one, ensuring that no sub-period will be addressed twice during a measurement cycle. The resolution provided by this example is one nanosecond, so that time intervals proportional to distances to faults may be measured within four inches (10 centimeters) of cable.

Another embodiment built and tested employs inexpensive off-the-shelf clocks of 9.83 MHz for clock A and 10 MHz for clock B. The number of stimulus pulses launched is one hundred, so that resolution again is one nanosecond, or 0.33 feet of cable. The stimulus pulses are launched 11,187 nanoseconds (11.187 microseconds) apart, ensuring that a clock B edge will increment by 13 nanoseconds into each next successive stimulus pulse duration. This increment will allow all one hundred sub-periods to be addressed once during a measurement cycle, without any skipped or addressed more than once.

In a third proposed embodiment, the frequency of clock A is chosen to be 2.457 MHz, with clock B remaining at 10 MHz, to avoid the tendency of two clocks having closely related frequencies to attempt to synchronize with each other. The stimulus pulses are launched 40,293 nanoseconds apart, ensuring that a clock B edge will increment by seven nanoseconds into each next successive stimulus pulse duration.

It is therefore one object of the invention to provide a dual time base, zero dead zone TDR.

It is another object to provide a dual time base TDR capable of accurate, high-resolution measurements using relatively low-frequency measuring circuits.

It is a feature of the present invention to provide a low cost, highly portable, inexpensive and easy-to-use TDR exhibiting low power consumption for battery operation in testing a variety of cables, including those associated with local-area networks.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
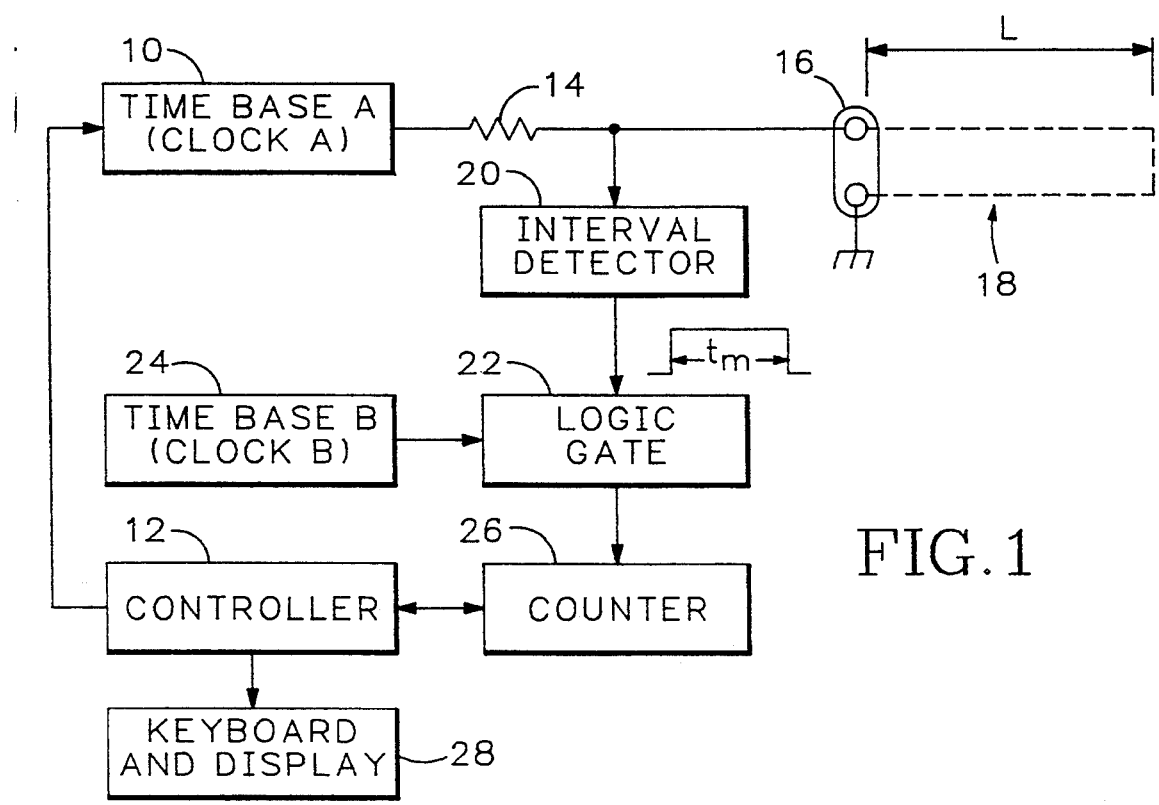
FIG. 1 is a block diagram of a dual time base, zero dead zone time domain reflectometer (TDR) in accordance with the present invention.

Referring to FIG. 1 of the drawings, there is shown in block diagram form a dual time-base, zero dead-zone time domain reflectometer (TDR) in accordance with the present invention. A first time base (Time Base A) 10, which may suitably be a clock circuit (clock A) having a first predetermined frequency A, repetitively launches stimulus pulses in response to command signals from a controller 12, which may suitably be a microprocessor. The stimulus pulses are applied via an impedance-matching resistor 14 to an output connector 16, to which may be connected a transmission system 18, indicated by dashed lines, having a length L. The duration of the stimulus pulses is preferably long enough to permit a signal transition, or pulse edge, to travel the length L and back to the TDR in reflected form. The reason for this is to allow time for reflections from the far end of the transmission system 18, as well as reflections from close-by faults, e.g., within one foot, to be received before termination of the launched stimulus pulse, thereby capturing a reflection from anywhere in the transmission system and eliminating the dead zone in the first few feet of the transmission system. As noted earlier, a pulse launched into a transmission system travels at a propagation velocity $v_p$, which is a percentage of the speed of light. For an electrical cable, $v_p$ is typically 67% of the speed of light, or about equal to eight inches per nanosecond (or 20 centimeters per nanosecond). If transmission system 18 is a coaxial cable, or a twisted pair of wires, or similar type of transmission line, we may assume that propagation velocity $v_p \sim \frac{2}{3}$ ft/nS (feet per nanosecond) or 20 cm/nS (centimeters per nanosecond). Thus for a 2,000-foot cable, a pulse and its reflection would in combination travel 4,000 feet and would require about six microseconds (6 $\mu$S).

A measurement cycle may be defined as the total time duration of a predetermined number of repetitive stimulus pulses that is required to accurately measure the distance D from the TDR to the fault (or discontinuity caused by the end of a cable having a length L). Controller 12 may suitably include an internal counter to establish and keep track of the number of repetitive stimulus pulses per measurement cycle, and the duration of each stimulus pulse. Thus, for example, if shorter cables are being tested, as may be the case for local-area networks, appropriate intervals shorter than the six microseconds required to test a 2000-foot cable may be selected. On the other hand, if longer cables are being tested, appropriate intervals longer than six microseconds may be selected.

The leading edge of each stimulus pulse and its reflection are applied to an interval detector 20 to provide a gate pulse having a length or measurement time interval $t_m$ equal to the time that it takes for the leading edge of the pulse to propagate through the transmission system to a discontinuity (e.g., a fault or the end of the cable) and be reflected therefrom back to the TDR. Accordingly, for each repetitive stimulus pulse, a gating pulse of measurement time interval $t_m$ is produced. The gating pulses are applied to one input of a logic gate 22.

A second time base (Time Base B) 24, which may suitably be a clock circuit (clock B) having a second predetermined frequency B, is connected to another input of logic gate 22. The output of logic gate 22 is connected to the input of a counter 26. During the measurement time interval $t_m$ of the gating pulse, clock edges or signals from the second time base 24 are counted. Counter 26 accumulates a count of the clock signals from clock B of time base 24 for an entire measurement cycle. In other words, the measurement time interval $t_m$ will repeat for each stimulus pulse launched during the measurement cycle, enabling logic gate 22. As will soon be understood, depending on the duration of measurement time interval $t_m$, clock signals from clock B of time base 24 may or may not pass through logic gate 22 each time logic gate 22 is enabled. For longer cables or longer measurement time intervals, the number of clock B edges passed by logic gate 22 may be greater than the number of stimulus pulses. The count output of counter 26 is received by controller 12, which in turn determines from the count output the distance D to a fault or the end of a cable. That is, since distance $D = v_p \cdot \frac{1}{2} t_m$, as mentioned earlier, and $v_p$ for an electrical cable or typically twisted pair of wires is about $\frac{2}{3}$ ft/nS, it can be shown mathematically that the distance may be calculated as $D = t_m$ (in nanoseconds) multiplied by four inches (or ten centimeters) per nanosecond. The calculated distance D is sent by controller 12 to a human interlace unit 28, which includes a keyboard and a display device, such as a liquid crystal display device or the like.

An important aspect of the present invention is the implementation of a dual time base which uses two clock circuits of relatively low frequency to measure very short time intervals. These short time intervals are determined by dividing the period of clock B (the measurement period) by the number of repetitive stimulus pulses launched to provide a plurality of equal sub-periods of the measurement period, which in turn defines the measurement resolution of the TDR. Assume that the frequency B of clock B is 10 MHz, and, accordingly, the clock period of clock B is equal to 100 nS. If a measurement cycle comprises 100 stimulus pulses launched, the measurement period (in this case, 100 nS) is divided into 100 one-nanosecond sub-periods. The key to making this work is selecting a number N of clock cycles for each successive stimulus pulse to ensure that the stimulus pulse has a sufficient duration to measure the length of a given cable, and that each one nanosecond sub-period will be addressed by a clock B edge only once for each measurement period without skipping any sub-periods. Therefore, if both clocks A and B are allowed to free run continuously, it can be appreciated that for every 100 cycles of clock A, and for every 101 cycles of clock B, the clock edges of the two clocks A and B will be coincident. For all other cycles of the two clocks A and B, the phases of the two clocks will shift by one nanosecond for each clock cycle. That is, the clock edges will converge on consecutive clock cycles at one-nanosecond intervals from 100 nS (or zero nS because of coincidence) to zero nS. Thus, for every 100 cycles of clock B, a clock edge will be generated at each of 100 one-nanosecond sub-periods of a 100 nS measurement period represented by one period of clock B, giving rise to a measurement of 100 nS if all of the clock B clock edges are counted for one 100 nS measurement period. A measurement cycle, of course, may include many measurement periods. For example, a six-microsecond measurement cycle will include sixty 100 nS measurement periods.

Figure 2:
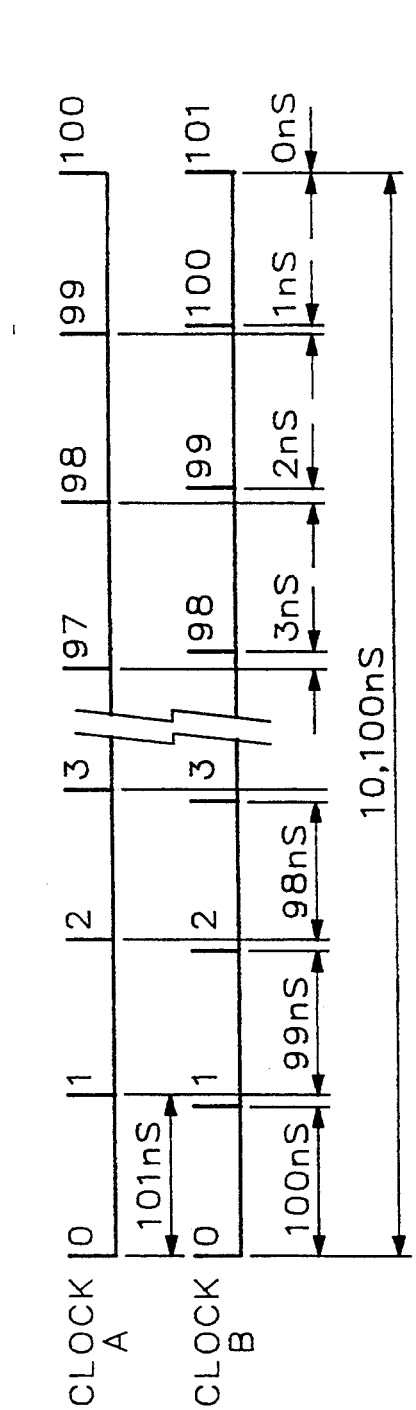
FIG. 2 shows the relationship between two clocks of a dual time base TDR in accordance with the present invention.

To better understand this phenomenon, refer to FIG. 2, wherein for simplicity the clock edges are shown as vertical hash marks, and begin with the coincidence of the zeroeth edges for both clocks A and B, and end with coincidence again 10,100 nanoseconds later at the 100th and 101st edges, respectively. One must keep in mind that the clock A is associated with the leading edge of the launched stimulus pulse, and clock B is associated with transitions that are counted in making time measurements. Thus, it can be discerned that if a stimulus pulse is launched in synchronism with each 100th clock A edge, that is, if the stimulus pulses are launched 10,100 nanoseconds apart, there will be no incremental shift in the phase of the two clocks A and B, and the same one-nanosecond sub-period will be addressed repeatedly for each successive stimulus pulse while the other 99 sub-periods will be skipped, resulting in an erroneous count of either 100 or zero.

In selecting a number N of cycles of clock A to effect a stimulus pulse launch, it must be recognized in this example that the period of a stimulus pulse is 6 μS (6000 nS) and that more than 59 cycles of clock A at 101 nanoseconds per cycle are required for each stimulus pulse. Choosing N=99 cycles of clock A per stimulus pulse results in a desired one-nanosecond phase shift between the leading edge of the stimulus pulse and the leading edge of the measurement clock B, and, hence, in sub-periods being addressed on each successive stimulus pulse, ensuring that all sub-periods of the 100 nS measurement period would be addressed only once over the measurement cycle, and none would be skipped. That is, the time for 99 cycles of clock A is 9,999 nS, during which time an edge or transition of clock B would fall one nanosecond short of completing 100 cycles, and clock B would complete 100 cycles, producing the 101st clock edge one nanosecond into the next stimulus pulse cycle. The one-nanosecond shift occurs on each successive stimulus pulse, so after 100 stimulus pulses, all one hundred sub-periods of each 100 nanosecond measurement period have been accounted for. It is not critical that the clock edge clock B be coincident with the clock edge clock A at beginning of a measurement cycle, allowing the two clocks to simply free run.

In selecting the number N of cycles of clock A to effect the duration of a stimulus pulse, it can be demonstrated that as long as the incremental value of the phase shift between the two clocks A and B (in addition to the number one) is an odd number and unevenly divisible into the measurement period (100 in this instance), all sub-periods will be addressed only once, and none will be skipped. If 97 cycles of clock A were chosen, the total time would be 9797 nS, during which time clock B would fall three nanoseconds short of completing 98 cycles and producing its 99th edge. This would work also; however, in reducing the number N of cycles it should be kept in mind that sufficient time must be allowed to permit the TDR and its microprocessor and other circuits to reset between stimulus pulses. Thus, the incremental value of the phase shift between the two clocks A and B for this example may one, three, seven, or nine, et cetera, nanoseconds, but not two, four, five, or ten, et cetera, nanoseconds for a 100-nanosecond measurement period.

It can be appreciated that the feature described above wherein a complete measurement cycle may be effected with only 100 launched stimulus pulses differs from a statistical approach wherein several thousand stimulus pulses are launched and a statistical average calculated from the readings taken. Moreover, for the example given above, a complete measurement cycle will take slightly under one millisecond (9,999 nS per stimulus pulse times 100 stimulus pulses).

Figure 3A:
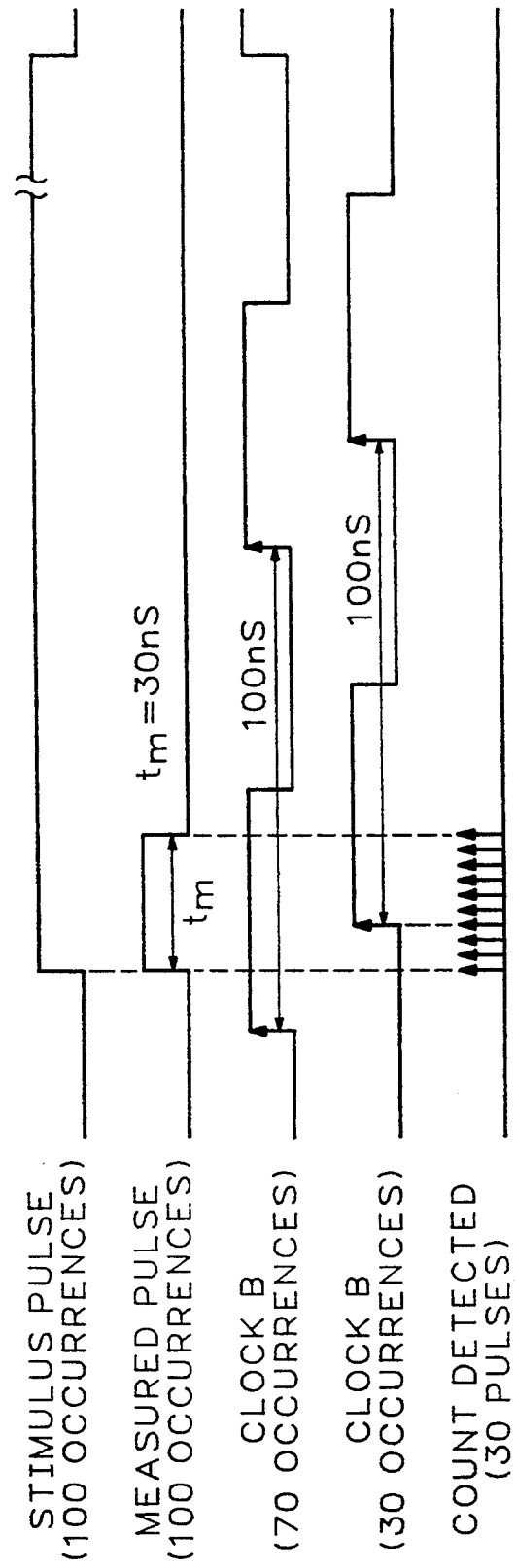
FIGS. 3A through 3C are examples to explain the operation of a dual time base TDR in accordance with the present invention.
Figure 3B:
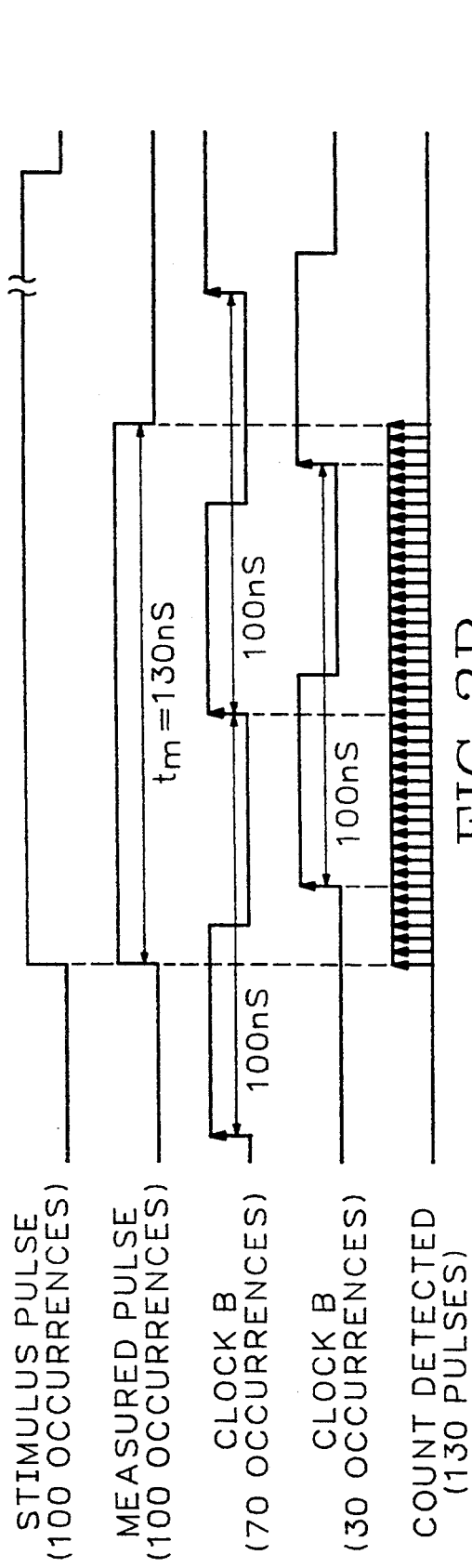
Figure 3C:
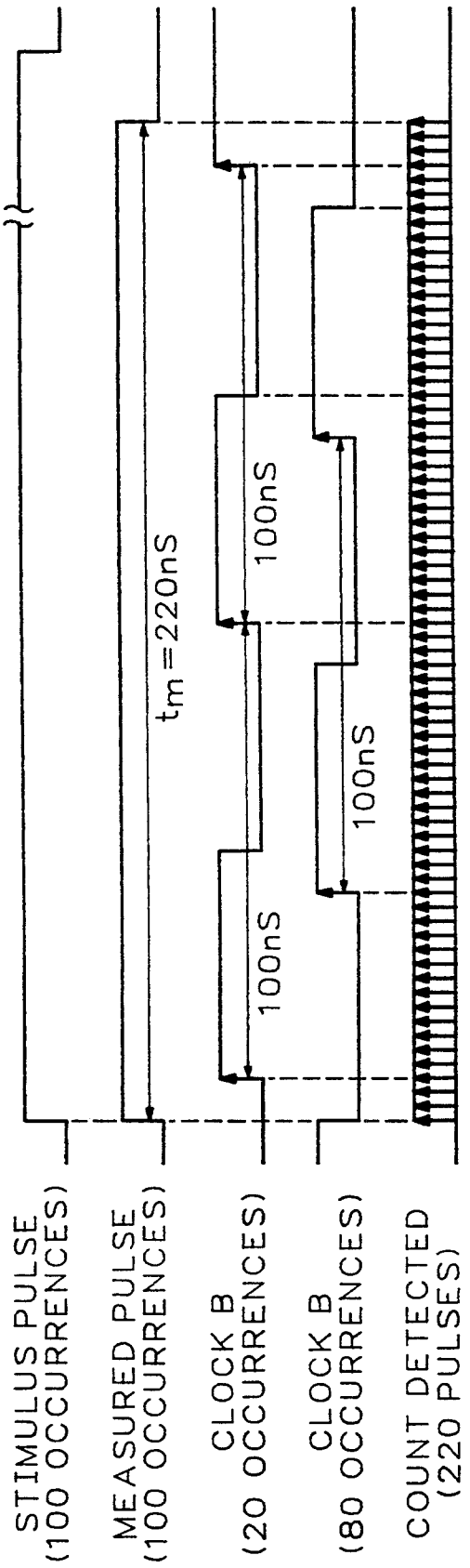

To fully appreciate the concept described herein, consider the following examples taken in conjunction with FIGS. 3A–3C. First, consider a situation in which the measurement time interval $t_m$ to be measured is less than one 100-nanosecond period of clock B, and periods of clocks A and B are 101 and 100 nS, respectively, as discussed above. Enabling logic gate 22 one hundred times (once for each stimulus pulse) over a complete measurement cycle results in counter 26 accumulating a count that is proportional to a percentage of the number of clock edges produced by clock B over the complete measurement cycle. When the sub-periods of a 100 nS measurement period are one nanosecond as in this example, the count will be equal to the number of clock B edges which pass through logic gate 22. Suppose the measurement time interval $t_m$ is 30 nanoseconds as shown in FIG. 3A, indicating a fault located a distance ten feet away from the TDR. The stimulus pulse is launched 100 times, and logic gate 22 is enabled 100 times by the 30-nanosecond measurement time interval to provide a complete measurement cycle. On 70 occurrences of logic gate 22 being enabled, no clock B edge passes through logic gate 22. However, on 30 occurrences of logic gate 22 being enabled, 30 clock B edges pass through logic gate 22 (one on each occurrence), resulting in counter 26 incrementing 30 times, one count for each nanosecond sub-period of the measurement time interval. Likewise, it can be demonstrated that if the measurement time interval $t_m$ is only one nanosecond in length, counter 26 will increment only once over the entire measurement cycle.

Next, consider a situation in which the measurement time interval $t_m$ is longer than one period of clock B, but less than two clock periods. Suppose as an example that the time interval to be measured is 130 nanoseconds in duration as shown in FIG. 3B. Again, logic gate 22 is enabled 100 times by the measurement time interval $t_m$, once for each stimulus pulse, this time each measurement time interval $t_m$ being a 130-nanosecond pulse. The output of logic gate 22 will be one clock edge per pulse for 70 occurrences of the 130-nanosecond pulse (70 counts), and two clock edges per pulse for 30 occurrences of the 130-nanosecond pulse (60 counts). The accumulated count, then, is 130, indicating 130 nanoseconds.

Now consider a situation in which the measurement time interval $t_m$ is longer than two periods of clock B. Suppose as an example that the time interval to be measured is 220 nanoseconds in duration as shown in FIG. 3C. This time the output of logic gate 22, which again is enabled 100 times (once for each stimulus pulse), will be three clock edges per pulse for 20 of the 220-second pulses (60 counts), and two clock edges per pulse for 80 of the 220-nanoseconds pulses (160 counts). The accumulated count over the measurement cycle is 220, indicating a measured time interval of 220 nanoseconds.

Figure 4:
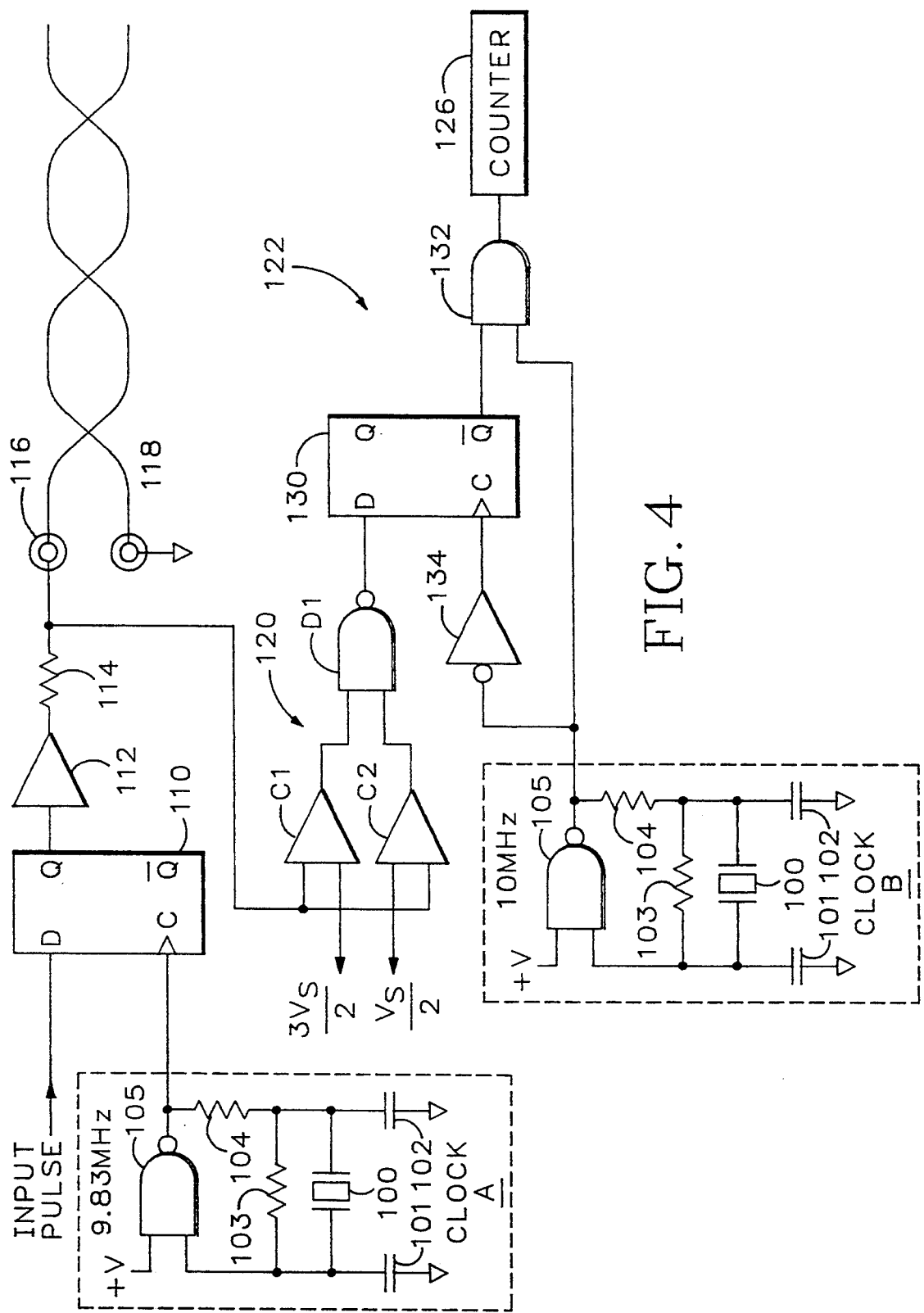
FIG. 4 is a circuit diagram of a preferred embodiment of the present invention.

With an understanding of the principles of the present invention gained from the foregoing examples, refer now to the circuit schematic of a preferred embodiment shown in FIG. 4. This embodiment has been manifested as a prototype for a local-area network (LAN) tester, so specific component values and conditions will be used in the description; however, as will become apparent to those skilled in the art, this embodiment is illustrative of the concepts of the present invention and is not intended as a limitation of the invention in its broader aspects. The waveforms shown in FIGS. 5A and 5B, which depict circuit action for open-condition and short-condition reflections, respectively, will aid in understanding operation.

Clocks A and B, both of which are enclosed by dashed lines in FIG. 4, are substantially identical except for the clock elements themselves, and so the description will apply to both. Clock element 100 is an inexpensive commercially available off-the-shelf low power CMOS clock having a nominal frequency of 9.83 MHz for clock A and 10 MHZ for clock B. The associated elements to complete the clock circuits include capacitors 101 and 102, resistors 103 and 104, and a NAND gate 105. In a circuit designed and tested, capacitor 101 and 102 had values of 10 picofarads and 22 picofarads, respectively, and resistors 103 and 104 had values of 100 kilohms and one kilohm, respectively. The period of free running clock A is 101.7 nanoseconds, and the period of free running clock B is 100 nanoseconds. From our earlier example in connection with FIG. 2, it can be seen that the clock edges will converge every 101,700 nanoseconds (101.7 $\mu$S) after 1000 cycles of clock A and 1017 cycles of clock B. However, to avoid the undesired effect of locking up at coincidence and missing counts, as discussed earlier in connection with the previous example, it is necessary to shift the phase of the launched stimulus pulse and clock B for each launch. To accomplish the desired result, the number N of clock A cycles selected should produce a duration having an even integer value, and an integer value for the incremental phase shift of the B clock. For example, 110 cycles of clock A will result in a duration of 11,187 nanoseconds (11.187 $\mu$S). If the stimulus pulses are launched every 11,187 nanoseconds, the edges of clock B increment by 13 nS on every repetitive stimulus pulse. If each sub-period of the measurement period is designated 0 through 99 consecutively, the sequence of addressing each sub-period wherein the increment is thirteen nanoseconds is, beginning with zero, 0, 13, 26, 39, 52, 65, 78, 91, 4, 17, . . . , 61, 74, 87, 0, and all one hundred of the one-nanosecond sub-periods are addressed once in a complete measurement cycle, without any sub-periods being skipped or addressed more than once. Thus, the resolution of the system is one nanosecond, or 0.33 feet (10 centimeters).

Figure 5A:
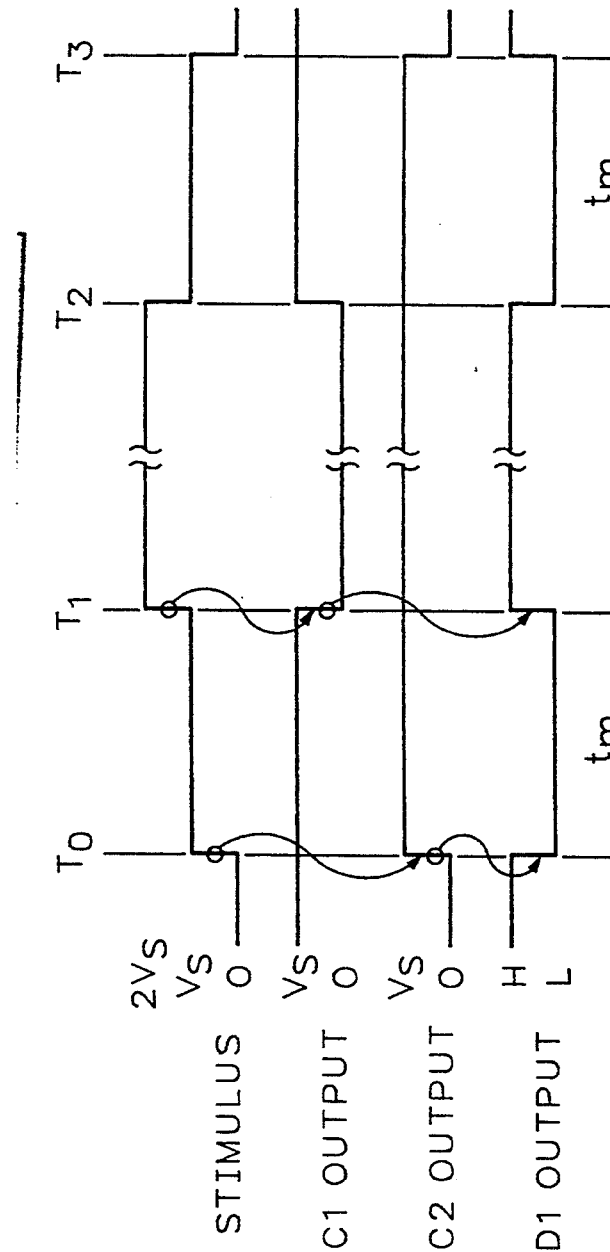
FIGS. 5A and 5B are waveform diagrams to aid in understanding the operation of the circuit of FIG. 4.
Figure 5B:
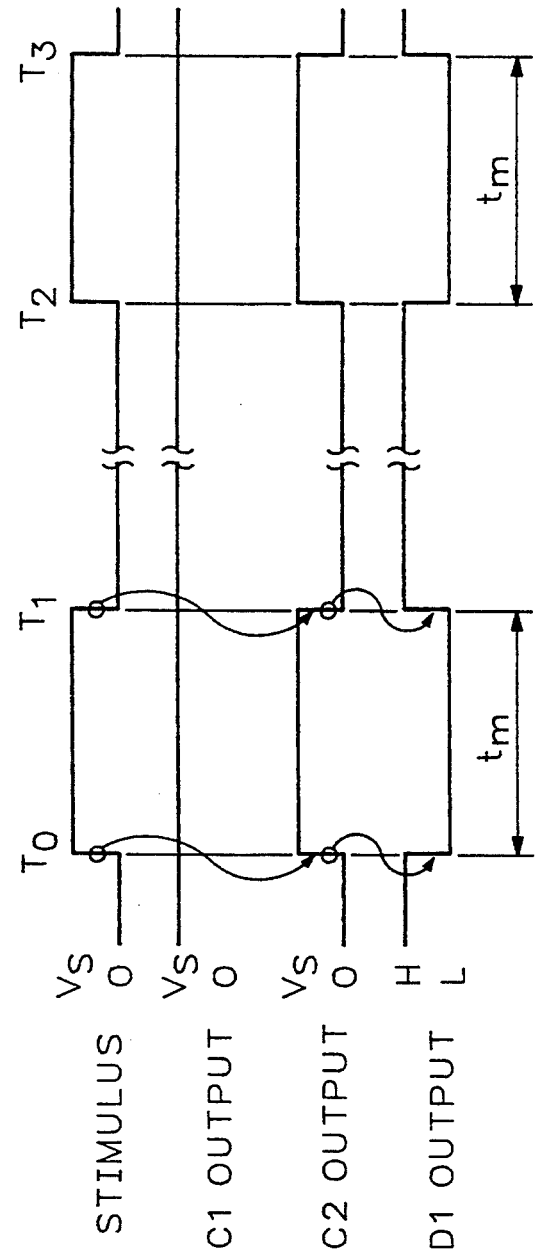

The continuous output of free running clock A is applied to the clock input of a D-type flip-flop 110. A positive-going input pulse from a microprocessor which controls the system is applied to the D input of flip-flop 110. The next clock edge from clock A causes the Q output of flip-flop 110 to go high, launching a positive-going stimulus pulse of magnitude $V_s$ at a time $T_0$ as depicted in FIGS. 5A and 5B. The stimulus pulse is applied via a driver 112, which performs as a high-impedance buffer to block high-energy reflections from entering the launch path, and an impedance-matching resistor 114 to output connector 116 and grounded connector 118. The cable shown connected to the output and grounded connectors is a twisted pair of wires such as those found in telephone cables. Resistor 114 has a value of 100 ohms to match the impedance of the twisted pair of wires.

The stimulus pulse of magnitude $V_s$ launched at time $T_0$ is also applied to an interval detector 120 comprising a pair of comparators C1 and C2, and a NAND gate D1. Note that a voltage proportional to 1.5 $V_s$ is applied to the non-inverting (+) input of comparator C1, and a voltage proportional to 0.5 $V_s$ is applied to the inverting (−) input of comparator C2. Prior to time $T_0$, before a stimulus pulse is applied, the voltage is zero at both the − input of comparator C1 and the + input of comparator C2. Consequently, prior to time $T_0$, the output of comparator C1 is high and the output of comparator C2 is low, and so the output of NAND gate D1 is high. Refer to both FIGS. 5A and 5B. At time $T_0$, the stimulus pulse voltage $V_s$ appearing at the − input of comparator C1 is insufficient to overcome the 1.5 $V_s$ on its + input, and so the output of comparator C1 remains high. However, the stimulus pulse voltage $V_s$ appearing at the + input of comparator C2 at time $T_0$ exceeds the voltage 0.5 $V_s$ on its − input, and so the output of comparator C2 goes high. With both inputs of NAND gate D1 now high at time $T_0^+$, the output of NAND gate D1 goes low, providing a gate signal to initiate the measurement time interval $t_m$.

Logic gate 122 receives both the gate signal from interval detector 120 and measurement clock signals from clock B, and passes a count signal to counter 126. Logic gate 122 comprises a D-type flip-flop 130, the /Q output of which is connected to one input of an AND gate 132. Clock B signals are applied via a logic inverter 134 to the clock input of flip-flop 130, and to a second input of AND gate 132. On the first negative-going clock B cycle following a logical low signal applied from the output of NAND gate D1 to the D input of flip-flop 130 at time $T_0^+$, the /Q output of flip-flop 130 goes high and remains high during the measurement time interval $t_m$. As long as the /Q output of flip-flop 130 remains high, any positive-going clock edge that occurs from clock B will pass through AND gate 132 and be counted by counter 126.

When a reflection from a fault or the end of the cable propagates back to connector 116 at time $T_1$, the measurement time interval $t_m$, will terminate. If the fault is an open condition, the reflected voltage will add to the stimulus pulse voltage $V_s$ at time $T_1$ and become 2 $V_s$, as shown in FIG. 5A. The voltage 2 $V_s$ at the − input of comparator C1 exceeds the voltage 1.5 $V_s$ on its + input at time $T_1$, causing the output of comparator C1 to go low while the output of comparator C2 remains high. If the fault is a short condition, the reflected voltage will subtract from the stimulus pulse voltage $V_s$ at time $T_1$ and become zero as shown in FIG. 5B. The zero volts applied to the + input of comparator C2 drops below the voltage 0.5 $V_s$ at its − input at time $T_1$, causing the output of comparator C2 to go low while the output of comparator C1 remains high. In either case, the output of NAND gate D1 goes high upon receipt of a reflection at time $T_1$.

The logical high at the output of NAND gate D1, and hence, at the D input of flip-flop 130, forces the /Q output of flip-flop 130 low on the next negative-going clock B transition applied via logic inverter 134 to the clock input of flip-flop 130, inhibiting logic gate 122 and terminating the measurement time interval $t_m$.

Because of the way in which the comparators and logic circuits of the interval detector 120 are operated, propagation delays in starting the measurement time interval at time $T_0$ are matched by propagation delays in terminating the measurement time interval at time $T_1$. Thus, the measurement time interval $t_m$ produced by this circuit is highly accurate, despite the circuit components being relatively inexpensive, exhibiting low power consumption, and being readily available commercially.

The stimulus pulse is terminated at time $T_2$ by the system microprocessor applying a logical low to the D input of flip-flop 110, causing the Q output of flip-flop 110 to go low on the next clock A positive-going transition. Note, however, that the reflected pulse continues until time $T_3$, resulting in a second measurement time interval $t_m$ being detected for each launched pulse. The second measurement time interval $t_m$ may either be ignored by inhibiting the detector comparators C1 and C2 or counter 126 after the first measurement time interval $t_m$ for each stimulus pulse launched, or both measurement time intervals may be used and the resulting count divided by two or otherwise factored in to provide accurate measurements.

Since the controller or microprocessor 12 has only to source and count pulses to take very accurate readings, a very low cost, simple micro-computer will suffice for the dual time base TDR herein described.

Because the components of the proposed commercial embodiment of a dual time base TDR shown in FIG. 4 require relatively low power, the entire circuit may be powered by conventional off the shelf batteries, e.g., a single nine-volt battery. Thus, a very compact, hand-held TDR may be realized in accordance with the present invention.

While the foregoing circuit operated well in a test environment, it is recognized that there is a tendency for two oscillators or clocks of nearly the same frequency to attempt to synchronize with each other if they are operated within close proximity to each other. The circuit was tested by substituting a clock having a widely different frequency for clock A. A computer clock having a frequency of 2.457 MHz (for a period of about 407 nanoseconds) was selected for clock A, and the frequency of clock B was 10 MHz (for a period of 100 nanoseconds) as described above. The period or duration of the stimulus pulse was selected to be N=99 cycles of clock A, or 40,293 nanoseconds, and 403 cycles of clock B at 100 nanoseconds per cycle results in a period of 40,300 nanoseconds, and thus the edges of clock B incremented by seven nanoseconds on every repetitive stimulus pulse. This can be verified by beginning with zero and incrementing by seven nanoseconds on each of 100 stimulus pulses. If each sub-period of the measurement period is designated 0 through 99 consecutively, the sequence of addressing each sub-period wherein the increment is seven nanoseconds is, beginning with zero, 0, 7, 14, 21, 28, 35, 42, 49, ..., 91, 98, 5, 12, 19, ..., 79, 86, 93, 0, and all one hundred of the one-nanosecond sub-periods are addressed once in a complete measurement cycle, without any sub-periods being skipped or addressed more than once. Keep in mind that it is not necessary for the sequence to begin at zero. It can begin at any sub-period. Thus, the resolution of the system is still one nanosecond, or 0.33 feet (10 centimeters).

While the examples given herein provide measurements with a resolution of one nanosecond, it should be understood that simply doubling the number of launched stimulus pulses merely provides two measurement cycles and does not result in halving the resolution. However, the resolution may changed by changing the period of either clock to establish a different number of sub-periods of the measurement period. For example, choosing 9.95 MHz (period of 100.5 nS) for clock A and 20 MHz (period of 50 nS) for clock B, with N=99 cycles of clock A for each of 100 stimulus pulses results in increment of 0.5 nS per launched stimulus pulse, with a 0.5 nS resolution.

While I have shown and described the preferred embodiment of my invention, it will be apparent to those skilled in the art that many changes and modifications may be made without departing from my invention in its broader aspects. It is therefore contemplated that the appended claims will cover all such changes and modifications as fall within the true scope of the invention.

What I claim as my invention is:

1. A time domain reflectometer, comprising:
    a controller which repetitively launches stimulus pulses into a transmission system in synchronism with Nth cycles of first clock signals from a first time base, wherein each stimulus pulse has a time duration that is at least twice the time required for propagation through said transmission system, and further wherein a predetermined number of stimulus pulses defines a measurement cycle;
    a measurement time interval detector which repetitively produces gate enable signals, each of which have a time interval substantially equal to a time that elapses between each stimulus pulse and its reflection;
    a second time base having a frequency different from said first time base and producing second clock signals whose period defines a measurement period having a number of equal sub-periods equal to said predetermined number of stimulus pulses;
    a gate circuit responsive to said gate enable signals and said second clock signals and passing transitions of said second clock signals which occur while gate enable signals are present; and
    a counter for counting said transitions during said measurement cycle.

2. A time domain refelectometer in accordance with claim 1 further including means coupled to said counter for converting a count of said transitions to a measured distance.

3. A time domain reflectometer in accordance with claim 2 further including means for displaying said measured distance.

4. A time domain reflectometer in accordance with claim 1 wherein the phase difference between said first and second time bases is such that in one measurement cycle a second clock edge falls once at each of said predetermined number of equal sub-periods.

5. A time domain reflectometer in accordance with claim 1 wherein said controller includes a microprocessor.

6. A time domain reflectometer in accordance with claim 1 wherein said measurement time interval detector comprises a first comparator which produces a first output in response to receipt of a stimulus pulse and a second output in response to a reflection if the reflection is negative, a second comparator which produces an output in response to a reflection if the reflection is positive, and a logic circuit responsive to the outputs of said first and second comparators for producing said gate enable signal.

7. A time domain reflectometer, comprising:
    a first time base continuously producing N cycles of first clock signals at a first predetermined frequency and a second time base continuously producing second clock signals at a second predetermined frequency different from said first predetermined frequency, wherein the period of said second clock signals defines a measurement period having a predetermined number of equal sub-periods;
    control means for repetitively and synchronously with Nth cycles of said first clock signals launching a predetermined number of stimulus pulses into a transmission system to provide a measurement cycle, said stimulus pulses each having a reflection and a time duration equal to at least the time required for a stimulus pulse and its reflection to propagate through said transmission system, said time duration being determined by a predetermined number of cycles of said first clock signals;
    means for repetitively detecting a measurement time interval proportional to the time between each said stimulus pulse and its reflection; and
    means for counting said second clock signals which occur during said measurement time interval.

8. A time domain reflectometer in accordance with claim 7 wherein the phase difference between said first clock signals and said second clock signals is such that in one measurement cycle a second clock edge falls once at each of said predetermined number of equal sub-periods.

9. A time domain reflectometer in accordance with claim 7 wherein said control means includes a microprocessor.

10. A time domain reflectometer in accordance with claim 7 wherein said means for repetitively detecting a measurement time interval proportional to the time between each said stimulus pulse and its reflection comprises a first comparator which produces a first output in response to receipt of a stimulus pulse and a second output in response to a reflection if the reflection is negative, a second comparator which produces an output in response to a reflection if the reflection is positive, and a logic circuit responsive to the outputs of said first and second comparators for producing a gate enable signal proportional to said measurement time interval.

11. A time domain reflectometer in accordance with claim 10 wherein said means for counting said second clock signals which occur during said measurement time interval includes a gate responsive to coincidence of said gate enable signal and said second clock signals, and a counter for counting transitions of said second clock signals.

12. A time domain reflectometer in accordance with claim 11 wherein said control means is coupled to said counter to convert a count of said transitions to a measured distance.

13. A time domain reflectometer in accordance with claim 12 further including means for displaying said measure distance.

* * * * *